(12) United States Patent
Lee et al.

(10) Patent No.: US 11,658,048 B2
(45) Date of Patent: May 23, 2023

(54) UNIT FOR SUPPLYING LIQUID, APPARATUS AND METHOD FOR TREATING SUBSTRATE HAVING THE UNIT

(71) Applicant: SEMES CO., LTD., Cheonan-si (KR)

(72) Inventors: Seong Soo Lee, Cheonan-si (KR); Buyoung Jung, Cheonan-si (KR); Gi Hun Choi, Changwon-si (KR); Myung A Jeon, Yeosu-si (KR); Soo Young Park, Incheon (KR)

(73) Assignee: Semes Co., Ltd., Chungcheongnam-do (KR)

( * ) Notice: Subject to any disclaimer, the term of this patent is extended or adjusted under 35 U.S.C. 154(b) by 35 days.

(21) Appl. No.: 16/906,392

(22) Filed: Jun. 19, 2020

(65) Prior Publication Data
US 2020/0402818 A1     Dec. 24, 2020

(30) Foreign Application Priority Data
Jun. 24, 2019  (KR) .......................... 10-2019-0075144

(51) Int. Cl.
*H01L 21/67* (2006.01)
*H01L 21/673* (2006.01)

(52) U.S. Cl.
CPC .... *H01L 21/6715* (2013.01); *H01L 21/67253* (2013.01); *H01L 21/67309* (2013.01)

(58) Field of Classification Search
CPC ........... H01L 21/6715; H01L 21/67253; H01L 21/67309; H01L 21/67017; H01L 21/6719;
(Continued)

(56) References Cited

U.S. PATENT DOCUMENTS 6,878,303 B2 *  4/2005  Okamoto .......... H01L 21/67253
                                                  118/712
9,142,424 B2 *  9/2015  Uchida .................... C25B 1/29
(Continued)

FOREIGN PATENT DOCUMENTS

JP    2009-158597 A    7/2009
JP    2016-63035 A     4/2016
(Continued)

OTHER PUBLICATIONS

Korean Office Action dated Office Action dated Aug. 21, 2020 issued in corresponding Korean Appln. No. 10-2019-0075144.
(Continued)

*Primary Examiner* — Mohammed Shamsuzzaman
(74) *Attorney, Agent, or Firm* — Harness, Dickey & Pierce, P.L.C.

(57) ABSTRACT

An apparatus and a method for performing liquid treatment for a substrate are provided. The apparatus for treating the substrate includes a treating container having a treatment space inside the treating container, a substrate support unit to support a substrate in the treatment space, and a liquid supply unit to supply treatment liquid to the substrate supported by the substrate support unit. The liquid supply unit includes a nozzle, a supply line to supply the treatment liquid to the nozzle and having a first valve mounted in the supply line, and a discharge line branching from a branch point which is a point downstream of the first valve in the supply line to discharge the treatment liquid from the supply line, and having a second valve mounted in the discharge line. A valve is absent in an area between the branch point and the nozzle, in the supply line.

18 Claims, 9 Drawing Sheets

(58) Field of Classification Search
CPC ......... H01L 21/67051; H01L 21/02052; H01L 21/02057; H01L 21/67259; H01L 21/683
See application file for complete search history.

(56) References Cited

U.S. PATENT DOCUMENTS

| | | | | |
|---|---|---|---|---|
| 9,831,016 | B2* | 11/2017 | McDonald | H01B 13/00 |
| 11,043,398 | B2* | 6/2021 | Iwao | H01L 21/67051 |
| 2003/0176029 | A1* | 9/2003 | Sugimoto | H01L 21/67051 |
| | | | | 438/200 |
| 2008/0110766 | A1* | 5/2008 | Hayamizu | C25B 1/30 |
| | | | | 204/263 |
| 2008/0142051 | A1* | 6/2008 | Hashizume | H01L 21/67051 |
| | | | | 134/23 |
| 2009/0031948 | A1* | 2/2009 | Ito | H01L 21/67051 |
| | | | | 134/115 R |
| 2009/0078582 | A1* | 3/2009 | Kobayashi | C25B 1/29 |
| | | | | 204/263 |
| 2010/0108096 | A1* | 5/2010 | Minami | H01L 21/6708 |
| | | | | 134/10 |
| 2013/0269599 | A1* | 10/2013 | Lin | C30B 25/165 |
| | | | | 118/733 |
| 2014/0373882 | A1* | 12/2014 | Yoshida | B08B 3/02 |
| | | | | 134/108 |
| 2015/0093906 | A1* | 4/2015 | Kobayashi | H01L 21/67017 |
| | | | | 438/748 |
| 2015/0262737 | A1* | 9/2015 | Hinode | H01L 21/0206 |
| | | | | 156/345.18 |
| 2016/0093515 | A1* | 3/2016 | Namba | H01L 21/67115 |
| | | | | 156/345.15 |
| 2017/0256423 | A1* | 9/2017 | Saito | H01L 21/67017 |
| 2017/0256426 | A1* | 9/2017 | Iwao | H01L 21/67051 |
| 2019/0228990 | A1* | 7/2019 | Hinode | H01L 21/31111 |
| 2019/0240597 | A1* | 8/2019 | Negoro | H01L 21/30604 |
| 2020/0402818 | A1* | 12/2020 | Lee | H01L 21/67051 |

FOREIGN PATENT DOCUMENTS

| | | | | |
|---|---|---|---|---|
| JP | 2016-63074 A | 4/2016 | | |
| JP | 2018-13719 A | 1/2018 | | |
| JP | 2018-137637 A | 8/2018 | | |
| JP | 2019-87652 A | 6/2019 | | |
| KR | 20070078073 A | 7/2007 | | |
| KR | 10-2007-0122403 A | 12/2007 | | |
| KR | 20140086850 A | 7/2014 | | |
| KR | 20140089246 A | 7/2014 | | |
| WO | WO-2014050941 A1 * | 4/2014 | | G03F 1/82 |
| WO | WO-2015136872 A1 * | 9/2015 | | B08B 9/027 |

OTHER PUBLICATIONS

Korean Office Action dated Office Action dated May 26, 2021 issued in corresponding Korean Appln. No. 10-2019-0075144.
Japanese Office Action dated Sep. 27, 2022 issued in corresponding Japanese Patent Application No. 2020-101800.

* cited by examiner

FIG. 1

(PRIOR ART)

UNIT FOR SUPPLYING LIQUID, APPARATUS AND METHOD FOR TREATING SUBSTRATE HAVING THE UNIT

CROSS-REFERENCE TO RELATED APPLICATIONS

A claim for priority under 35 U.S.C. § 119 is made to Korean Patent Application No. 10-2019-0075144 filed on Jun. 24, 2019, in the Korean Intellectual Property Office, the entire contents of which are hereby incorporated by reference.

BACKGROUND

Embodiments of the inventive concept described herein relates to an apparatus and a method for treating a substrate, and more particularly to an apparatus and a method for performing liquid treatment for a substrate.

To fabricate a semiconductor device, a desired pattern is formed on a substrate through various processes such as, photolithography, etching, ashing, ion implantation, and thin film deposition processes. The processes are varied and complicated with time, so contaminants and particles are produced. Accordingly, a cleaning process is performed in a stage before and after the processes.

Figure 1:
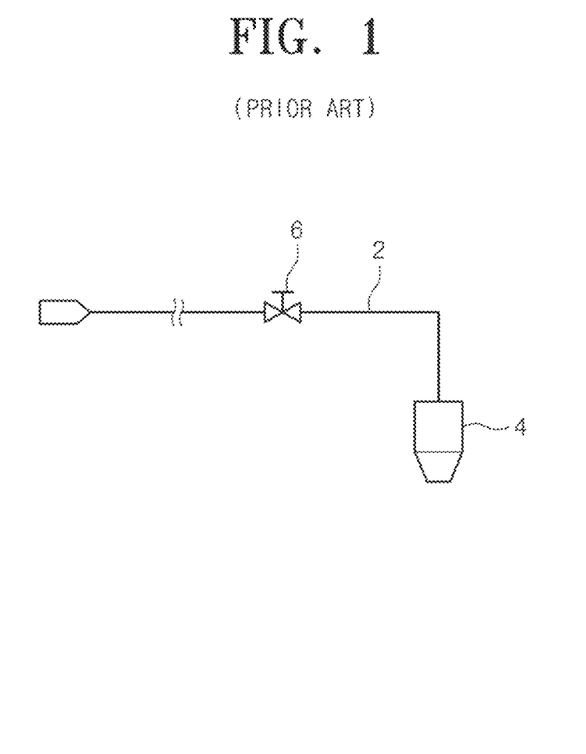
FIG. 1 is a view illustrating a typical unit for supplying liquid.

The cleaning process includes a liquid treatment process to supply chemicals onto the substrate. FIG. 1 is a view illustrating a typical unit for supplying liquid. Referring to FIG. 1, the unit for supplying the liquid has a liquid supply line 2 and a valve 6. The liquid supply line 2 is connected to a nozzle 4 to supply liquid to the nozzle 4. The valve 6 is mounted in the liquid supply line 2 to open or close the liquid supply line 2 so as to supply liquid or stop the supply of the liquid. The valve 6 adjusts the supply of the liquid by performing an opening or closing operation for a fluid passage through which chemicals flow. Such opening or closing operation of the valve 6 includes a collision process of a diaphragm, which is a major cause for the production of the particles.

Accordingly, chemicals containing particles are supplied to cause the failure to the liquid treatment process.

SUMMARY

Embodiments of the inventive concept provide an apparatus capable of supplying a purified liquid to a substrate.

Embodiments of the inventive concept provide an apparatus capable of minimizing production of particles in a valve of a liquid supply line.

According to an exemplary embodiment, an apparatus and a method for performing liquid treatment for a substrate are provided.

The apparatus for treating the substrate includes a treating container having a treatment space inside the treating container, a substrate support unit to support a substrate in the treatment space, and a liquid supply unit that supplies treatment liquid to the substrate supported by the substrate support unit. The liquid supply unit includes a nozzle, a supply line that supplies the treatment liquid to the nozzle and has a first valve mounted in the supply line, and a discharge line branching from a branch point which is a point downstream of the first valve in the supply line to discharge the treatment liquid from the supply line, and having a second valve mounted in the discharge line. A valve is absent in an area between the branch point and the nozzle, in the supply line.

An end of a downstream area of the supply line based on the branch point may be positioned higher than the discharge line.

The end of the downstream area may be positioned higher than the branch point. An area of the downstream area, which extends from the branch point in a downstream direction, may be provided to have a curved shape. The downstream direction may be downward provided in an upstream area of the supply line based on the branch point, and the curved shape may be provided in a convex-upward shape The liquid supply unit may further include a first sensor to sense a first water level of the treatment liquid in the downstream area. The downstream area may include a first part extending from the branch point and having the curved shape, a second part extending from the first part and provided at a position in a line with a position of the first part or lower than the position of the first part, and a third part extending from the second part, positioned higher than the first part, and including the end. The first sensor may be installed in the third part.

The liquid supply unit may further include a buffer that mounted downstream of the second valve in the discharge line to store temporarily the treatment liquid in the buffer. The buffer may include a housing mounted in the discharge line and having a buffer space in the housing, and a second sensor to sense a second water level of the treatment liquid filled in the buffer space.

The liquid supply unit may further include a pump to apply flow pressure to the treatment liquid flowing along the supply line, and a controller to adjust supply of the treatment liquid to the nozzle, and the controller may control the second valve such that the second valve is cut off in a supply mode to supply the treatment liquid to the nozzle, and open in a standby mode to stop the supply of the treatment liquid to the nozzle. The controller may cut off the first valve and the second valve, when receiving a sensing signal for the treatment liquid from the first sensor or the second sensor in the standby mode.

The controller may adjust the pump such that the treatment liquid is filled in the second part in the standby mode.

According to an exemplary embodiment, an apparatus for supplying liquid to a substrate includes a nozzle, a supply line to supply treatment liquid to the nozzle and having a first valve mounted in the supply line, and a discharge line branching from a branch point which is a point downstream of a first valve in the supply line to discharge the treatment liquid from the supply line, and having a second valve mounted in the discharge line. A valve is absent in an area between the branch point and the nozzle, in the supply line.

An end of a downstream area of the supply line based on the branch point may be positioned higher than the branch point and the discharge line.

An area of the downstream area, which extends from the branch point in a downstream direction, may have a curved shape. The downstream direction may be downward provided in an upstream area of the supply line based on the branch point, and the curved shape may be provided in a convex-upward shape. The liquid supply unit may further include a first sensor to sense a first water level of the treatment liquid in the downstream area. The downstream area may include a first part extending from the branch point and having the curved shape, a second part extending from the first part and provided at a position in a line with a position of the first part or lower than the position of the first part, and a third part extending from the second part, positioned higher than the first part, and including the end. The first sensor may be installed in the third part.

The liquid supply unit may further includes a buffer mounted downstream of the second valve in the discharge line to store temporarily the treatment liquid in the buffer, and the buffer may include a housing mounted in the discharge line and having a buffer space in the housing, and a second sensor to sense a second water level of the treatment liquid filled in the buffer space.

The liquid supply unit may further include a controller to adjust supply of the treatment liquid to the nozzle, and the controller may control the second valve such that the second valve is cut off in a supply mode to supply the treatment liquid to the nozzle, and open in a standby mode to stop the supply of the treatment liquid to the nozzle.

According to an exemplary embodiment, a method for treating a substrate using the apparatus for treating the substrate includes applying flow pressure to the supply line to supply the treatment liquid to a point higher than a highest point of the downstream area in the supply line, in a state that the first valve is open and the second valve is cut off, when supplying the treatment liquid to the substrate, and opening the second valve, and maintaining the flow pressure to prevent the treatment liquid from flowing to the highest point, when stopping the supplying of the treatment liquid to the substrate.

The first valve and the second valve may be cut off to prevent the treatment liquid from flowing to the highest point, when the supplying of the treatment liquid is stopped and when the treatment liquid is overflown from the discharge line.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

The embodiments of the inventive concept may be modified in various forms, and the scope of the inventive concept should not be construed to be limited by the embodiments of the inventive concept described in the following. The embodiments of the inventive concept are provided to describe the inventive concept for those skilled in the art more completely. Accordingly, the shapes and the like of the components in the drawings are exaggerated to emphasize clearer descriptions.

Hereinafter, one example of the inventive concept will be described in detail with reference to FIGS. 2 to 9.

Figure 2:
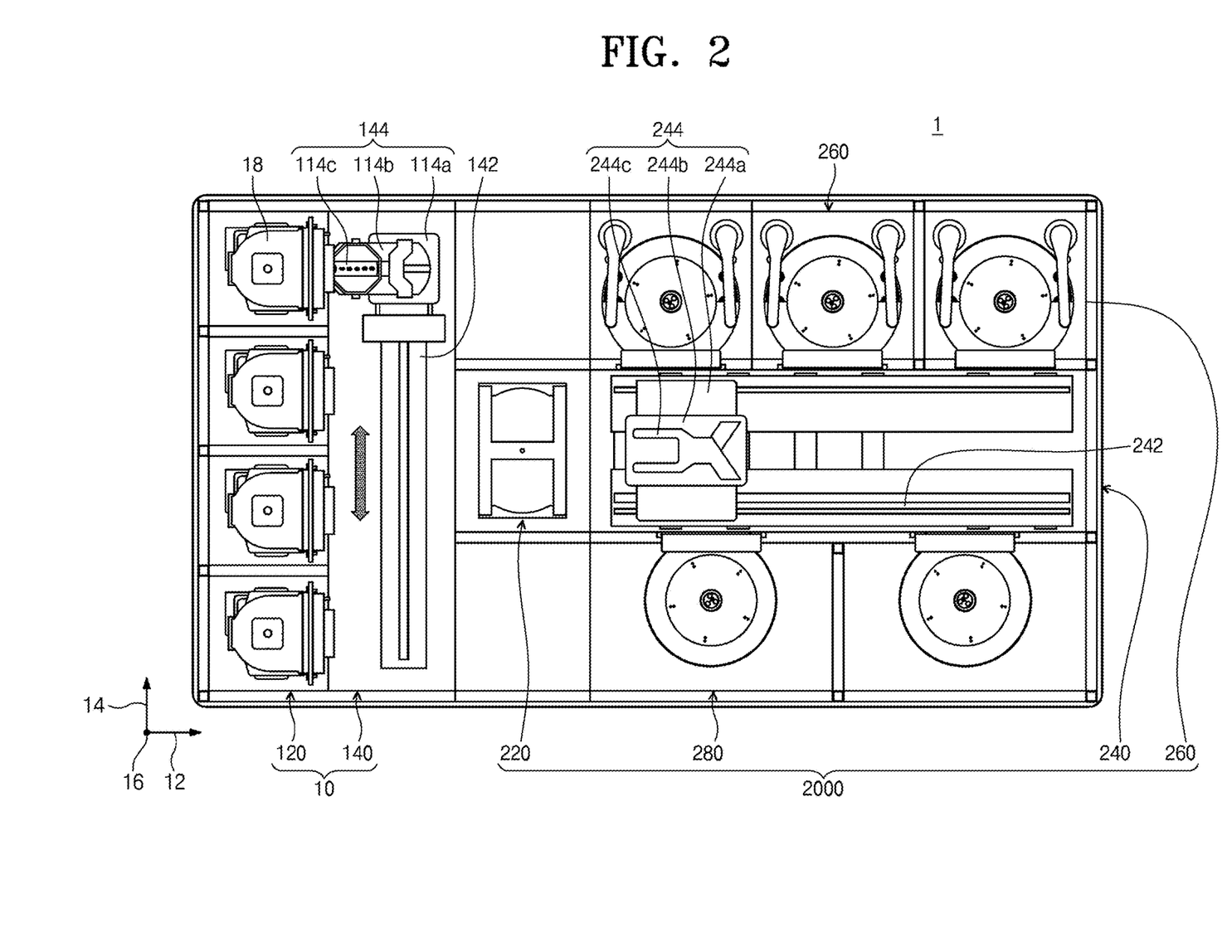
FIG. 2 is a plan view illustrating a substrate treating facility, according to an embodiment of the inventive concept.

FIG. 2 is a plan view illustrating a substrate treating facility, according to an embodiment of the inventive concept.

Referring to FIG. 2, a substrate treating facility 1 has an index module 10 and a process treating module 20, and the index module 10 includes a load port 120 and a feeding frame 140. The load port 120, the feeding frame 140, and the process treating module 20 may be sequentially arranged in a row. Hereinafter, a direction in which the load port 120, the feeding frame 140, and the process treating module 20 are arranged will be referred to as a first direction 12, a direction, which is perpendicular to the first direction 12 when viewed from above will be referred to as a second direction 14, and a direction, which is normal to a plane containing the first direction 12 and the second direction 14, will be referred to as a third direction 16.

A carrier 18 having a substrate 'W' received therein is seated on the load port 120. A plurality of load ports 120 are provided, and are arranged in the second direction 14 in a line. FIG. 1 illustrates that four load ports 120 are provided. However, the number of the load ports 120 may increase or decrease depending on a condition, such as the process efficiency of the process treating module 20 or a footprint. A slot (not illustrated) is formed in the carrier 18 to support the edge of the substrate. A plurality of slots are provided in the third direction 16, and substrates are positioned in the carrier 18 such that the substrates are stacked in the third direction 16 while being spaced apart from each other. A front opening unified pod (FOUP) may be used as the carrier 18.

The process treating module 20 includes a buffer unit 220, a feeding chamber 240, and process chambers 260 and 280. The feeding chamber 240 is disposed such that the longitudinal direction thereof is in parallel to the first direction 12. The process chambers 260 and 280 are arranged at opposite sides of the feeding chamber 240 in the second direction 14. The process chambers 260 and 280 may be provided symmetrically to each other about the feeding chamber 240. Some of the process chambers 260 and 280 are arranged in the longitudinal direction of the feeding chamber 240. In addition, some of the process chambers 260 and 280 are arranged to be stacked on each other. In other words, the process chambers 260 and 280 may be arranged in the form of a matrix of A×B ('A' and 'B' are natural numbers) at opposite sides of the feeding chamber 240. In this case, 'A' is the number of the process chambers 260 and 280 aligned in a line in the first direction 12, and 'B' is the number of the process chambers 260 and 280 aligned in a line in the third direction 16. When four or six process chambers 260 and 280 are provided at opposite sides of the feeding chamber 240, the first process chambers 260 and 280 may be arranged in 2×2 or 3×2. The number of the process chambers 260 may increase or decrease.

Unlikely, the process chamber 260 may be provided only at any one side of the feeding chamber 240. In addition, the process chambers 260 and 280 may be provided in a single layer at one side and an opposite side of the feeding chamber 240. In addition, unlike the above description, the process chambers 260 and 280 may be variously arranged.

The following description of the present embodiment will be made regarding that a liquid treatment process is performed in one (the process chamber 260) of the process chambers 260 and 280 and a drying process is performed in another (the process chamber 380) of the process chambers 260 and 280. The drying process may be a supercritical treatment process.

The buffer unit 220 is interposed between the feeding frame 140 and the feeding chamber 240. The buffer unit 220 provides a space in which the substrate 'W' stays before the substrate 'W' is carried between the feeding chamber 240 and the feeding frame 140. The buffer unit 220 is provided therein with a slot (not illustrated) in which the substrate 'W' is placed and a plurality of slots (not illustrated) are spaced apart from each other in the third direction 16. The buffer unit 220 is open in surfaces facing the feeding frame 140 and the feeding chamber 240.

The feeding frame 140 carries the substrate 'W' between the carrier 18 seated in the load port 120 and the buffer unit 220. An index rail 142 and an index robot 144 are provided on the feeding frame 140. The index rail 142 is provided such that the longitudinal direction thereof is in parallel to the second direction 14. The index robot 144 is installed on the index rail 142 to be linearly moved in the second direction 14 along the index rail 142. The index robot 144 has a base 114a, a body 114b, and a plurality of index arms 141c. The base 114a is installed to be movable along the index rail 142. The body 114b may be joined to the base 114a. The body 114b may be provided to be movable on the base 114a in the third direction 16. Furthermore, the body 114b may be provided to be rotatable on the base 114a. The index arm 114c may be joined to the body 114b such that the index arm 114c is movable forward and backward with respect to the body 114b. A plurality of index arms 114c may be provided, and may be driven independently from each other. The index arms 114c are disposed to be stacked while being spaced apart from each other in the third direction 16. Some of the index arms 114c are used when carrying the substrates 'W' to the carrier 18 from the process treating module 20, and others of the index arms 114c may be used when carrying the substrates 'W' from the carrier 18 to the process treating module 20. This structure may prevent particles, which are produced from the substrates 'W' before the process treatment, from sticking to the substrates 'W' after the process treatment, in the process that the index robot 144 introduces and withdraws the substrates 'W'.

The feeding chamber 240 carries the substrate 'W' between the buffer unit 220 and the process chambers 260. The feeding chamber 240 includes a guide rail 242 and an index robot 244. The guide rail 242 is disposed such that the longitudinal direction thereof is parallel to the first direction 12. The main robot 244 is installed on the guide rail 242 to linearly move in the first direction 12 on the guide rail 242.

Hereinafter, an apparatus (substrate treating apparatus) 300 for treating a substrate provided in the process chamber 260 will be described. The following description of the present embodiment will be described regarding that the substrate treating apparatus 300 performs a liquid treatment process. The liquid treatment process includes a process of cleaning the substrate.

Figure 3:
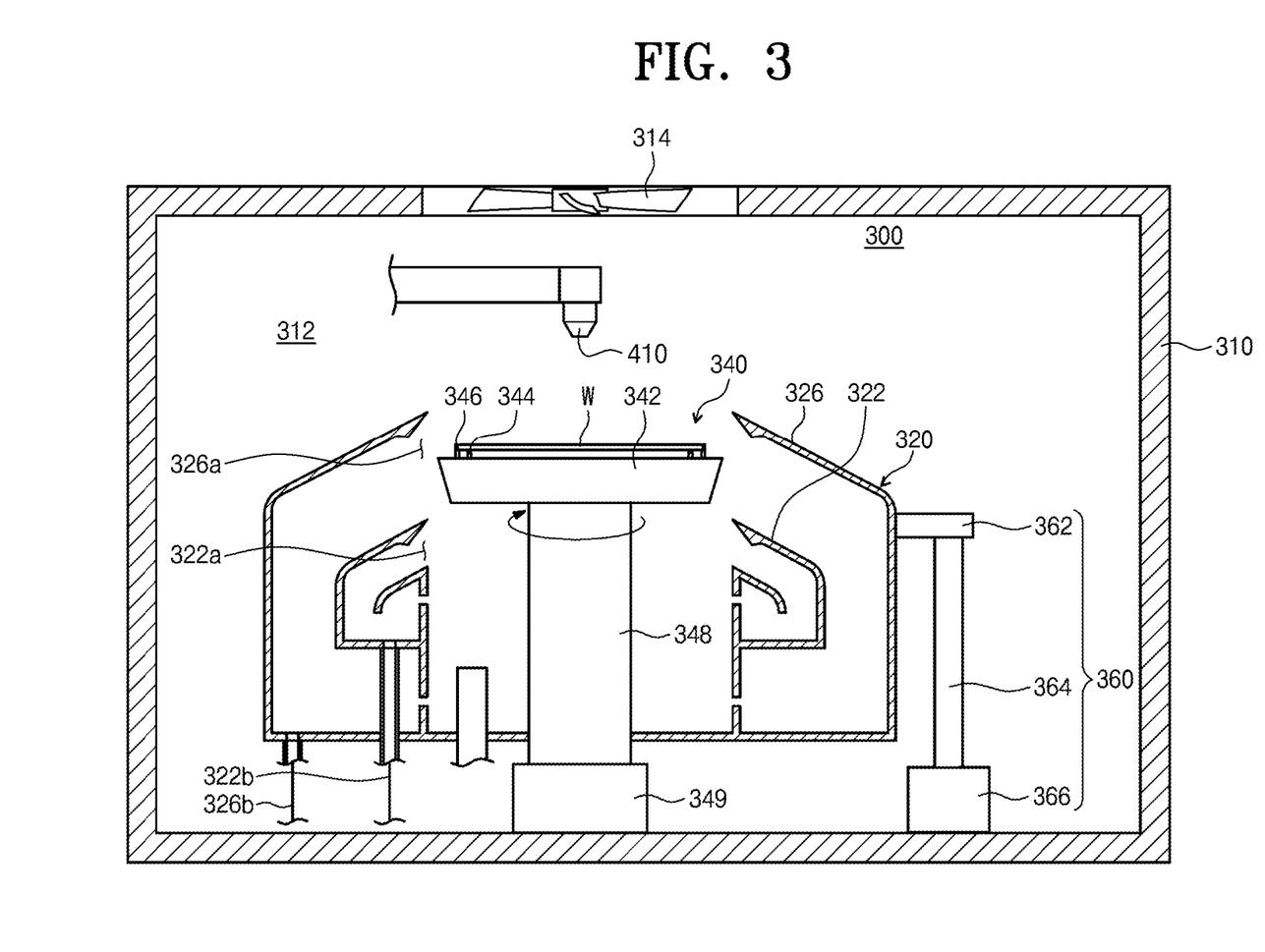
FIG. 3 is a sectional view illustrating a substrate treating apparatus of FIG. 2.

FIG. 3 is a sectional view illustrating the substrate treating apparatus of FIG. 2. Referring to FIG. 3, the substrate treating apparatus 300 may include a chamber 310, a treating container 320, a spin head 340, a lifting unit 360, a unit (liquid supply unit) 400 for supplying liquid (treatment liquid), and a controller 500. The chamber 310 provides a space for performing a process of treating the substrate 'W'. A fan 314 is mounted on a ceiling surface of the chamber 310 to form a down flow in a treatment space. The fan 314 may be positioned to face the treating container 310. The down flow formed by the fan 314 may be provided to a substrate 'W' positioned in the treating container 320.

The treating container 320 is positioned in the chamber 310, and has the shape of a cup having an open upper portion. The treating container 320 has a treatment space for treating a substrate therein. The treatment container 320 includes an inner recovery vessel 322 and an outer recovery vessel 326. The recovery vessels 322 and 326 recover mutually different treatment liquids used in the process. The inner recovery vessel 322 is provided to have the shape of an annular ring that surrounds the spin head 340, and the outer recovery vessel 326 is provided to have the shape of an annular ring that surrounds the inner recovery vessel 322. An inner space 322a of the inner recovery vessel 322 and a space 326a between the outer recovery vessel 326 and the inner recovery vessel 322 serve as inlets for introducing the treatment liquids into the inner recovery vessel 322 and the outer recovery vessel 326, respectively. Recovery lines 322b and 326b are connected with the recovery containers 822 and 826 to vertically extend downward from the bottom surfaces of the recovery containers 822 and 826. The recovery lines 322b and 326b serve as discharge pipes to discharge the treatment liquids introduced into the recovery vessels 322 and 326, respectively. The discharged treatment liquids may be recycled through an external treatment liquid recycling system (not illustrated).

The spin head 340 serve as a substrate support unit 340 to support and rotate the substrate 'W'. The spin head 340 is provided in the treatment container 320. The spin head 340 supports the substrate 'W' and rotates the substrate 'W' during the process. The spin head 340 has a body 342, a support pin 344, a chuck pin 346, and a support shaft 348. The body 342 has a top surface provided in a substantially circular shape when viewed from above. The support shaft 348 is fixedly coupled to the bottom surface of the body 342 to be rotatable by a motor 349. A plurality of support pins 344 are provided. The support pins 344 may be arranged to be spaced apart from each other at an edge part of the top surface of the body 342 while protruding upward from the body 342. The support pins 334 are arranged to form the shape of a typical annular ring through combination thereof. The support pins 344 support an edge of a rear surface of the substrate 'W' such that the substrate 'W' is spaced apart from the top surface of the body 342 by a specific distance. A plurality of chuck pins 346 are provided. The chuck pins 346 may be disposed to be farther away from the center of the body 342 than the support pin 344. The chuck pins 346 are provided to protrude upward from the body 342. The chuck pins 346 support side portions of the substrate 'W' such that the substrate 'W' does not laterally deviate from a right position thereof when the spin head 340 rotates. The chuck pins 346 are provided to be linearly movable between a standby position and a support position in a radial direction of the body 342. The standby position is farther apart from the center of the body 342 than the support position. When the substrate 'W' is loaded onto on or unloaded from the spin head 340, the chuck pins 346 are positioned at the standby position. When a process is performed with respect to the substrate 'W', the chuck pins 346 are positioned at the support position. The chuck pins 346 are in contact with the side portions of the substrate 'W' at the support position.

The lifting unit 360 may adjust the relative height between the treating container 320 and the substrate 'W'. The lifting unit 360 linearly moves the treatment container 320 upward and downward. As the treating container 320 moves upward and downward, a relative height of the treatment container 320 to the spin head 340 is changed. The lifting unit 360 has a bracket 362, a movable shaft 364, and a driver 366. The bracket 362 is fixedly installed on an outer wall of the treating container 320, and the movable shaft 364 is fixedly coupled to the bracket 362 to move upward and downward by the driver 366 When the substrate 'W' is placed on the spin head 340 or lifted from the spin head 340, the treating container 320 moves downward such that the spin head 340 protrudes upward from the treating container 320. The height of the treating container 320 is adjusted such that the treatment liquid is introduced into the recovery vessel 360 preset depending on the type of the treatment liquid supplied to the substrate 'W' when the process is performed.

Alternatively, the lifting unit 360 may move the spin head 340 upward and downward instead of the treating container 320.

A liquid supply unit 400 may supply various treatment liquids onto the substrate 'W'. The liquid supply unit 400 includes a nozzle 410, a supply line 420, a pump 428, a discharge line 440, a buffer 450, a circulation line 460, and a controller 500.

The nozzle 410 moves a process position and a standby position. In this case, the process position is defined as a position in which the nozzle 410 is able to discharge liquid onto the substrate 'W' positioned in the treating container 320, and the standby position is defined as a position in which the nozzle 410 deviates from the process position and stands by. According to an example, in the process position, a position, in which the nozzle 410 supplies to the liquid, includes the center of the substrate 'W'. For example, when viewed from above, the nozzle 410 may linearly move or rotate about an axis to move between the process position and the standby position.

The treatment liquid discharged from the nozzle 410 may include chemicals, a rinse liquid, and a dry fluid. For example, the chemicals correspond to liquid to etch a film formed on the substrate 'W' or to remove remaining particles from the substrate 'W'. The chemicals may be liquid having the properties of a strong acid or a strong base. The chemicals may include sulfuric acid, phosphoric acid, hydrofluoric acid, or ammonia. The rinse liquid may be liquid which is able to rinse the chemicals remaining on the substrate 'W'. For example, the rinse liquid may be pure water. The dry fluid may be provided as liquid that is able to replace a rinse liquid remaining on the substrate 'W'. The dry fluid may be liquid having a surface tension lower than that of the rinse liquid. The dry fluid may be an organic solvent. The dry fluid may be isopropyl alcohol (IPA).

Figure 4:
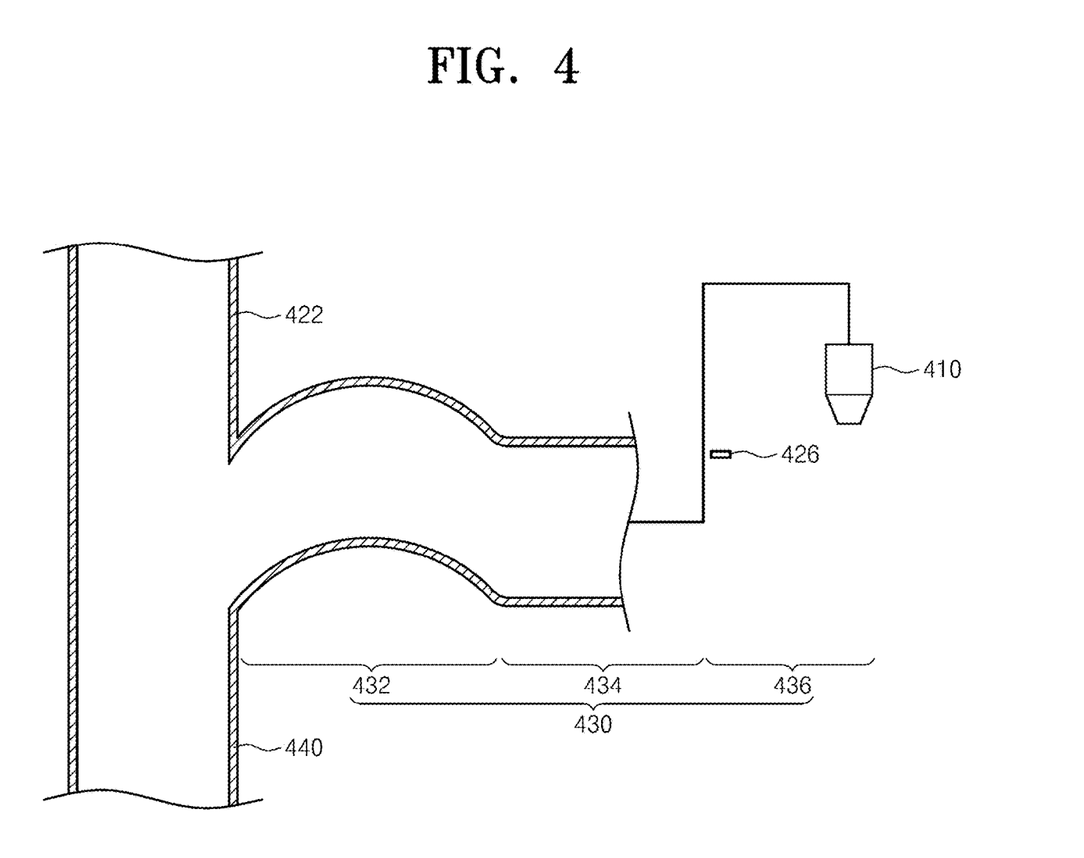
FIG. 4 is a view illustrating a liquid supply unit of FIG. 3.
Figure 5:
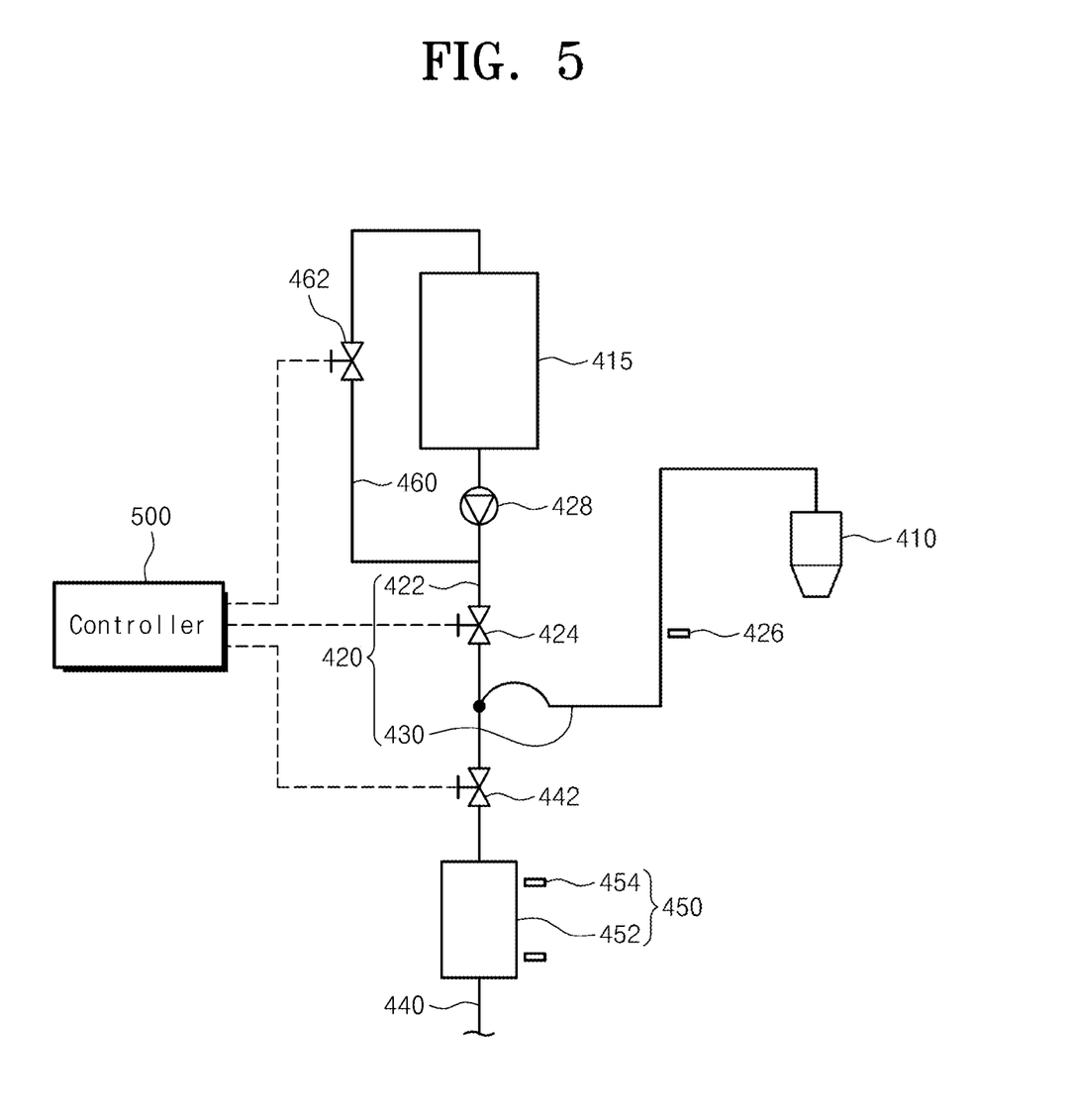
FIG. 5 is a view illustrating an enlarged part of a branch point and a downstream area of a supply line of FIG. 4.

FIG. 4 is a view illustrating the liquid supply unit of FIG. 3, and FIG. 5 is a view illustrating an enlarged part of a branch point and a downstream area of the supply line of FIG. 4. Referring to FIGS. 4 and 5, the supply line 420 connects a liquid tank 415 to the nozzle 410. The liquid stored in the liquid tank 415 is supplied to the nozzle 410 through the supply line 420. The pump 428 and a first valve 424 are mounted in the supply line 420, the pump 428 applies flow pressure to the treatment liquid, and the first valve 424 opens/closes the supply line 420. For example, the first valve 424 is positioned downstream of the pump 428. The discharge line 440 branches from the supply line 420 to discharge the liquid. A second valve 442 is mounted in the discharge line 440, and the discharge line 440 is open and closed by the second valve 442. The branch point of the discharge line 440 is positioned downstream of the first valve 424 in the supply line 420. For example, the discharge line 440 may branch from the supply line 420 and may be connected to the liquid tank 415. The second valve 442 may be positioned lower than the branch point.

According to the present embodiment, the supply line 420 is divided into an upstream area and a downstream area 430 based on the branch point of the discharge line 440.

An end of the downstream area 430 extending in a downstream direction from the branch point is positioned higher than the branch point, and an additional unit is not provided in the downstream area 430 to open or close the supply line 420 or to adjust the supply of the liquid. In other words, a valve is not mounted in the downstream area 430 and the supply of the liquid is adjusted using the difference in height between the branch point and the end of the downstream area 430.

The downstream area 430 has a first part 432, a second part 434, and a third part 436. The first part 432 extends from the branch point, has a curved shape, is positioned lower than the end of the downstream area 430. The second part 434 extends in the downstream direction from the first part 432. The second part 434 is positioned in a line with the first part 432 or lower than the first part 432. The third part 436 extends from the second part 434 and is connected to the nozzle 410. The third part 436 is positioned higher than the second part 434 and includes the end. For example, the downstream direction may be downward provided in an upstream area. The curved shape of the first part 432 may be provided to have a convex-upward shape. Accordingly, the upstream area, the downstream area 430, and the discharge line 440, which are adjacent to the branch point, may have a substantially 'Y' shape. The 'Y' shape may prevent the treatment liquid, which is supplied from the upstream area to the discharge line 440, from flowing to the downstream area 430. A first sensor 426 is mounted in the third part 436 to sense a first water level of the treatment liquid. The first sensor 426 is positioned higher than the first part 432. The first sensor 426 may be a level sensor. When sensing that the treatment liquid reaches the first water level in the third part 436, the first sensor 426 transmits a sensed signal to the controller 500.

The buffer 450 is mounted in the discharge line 440. The buffer 450 includes a housing 452 and a second sensor 454. The housing 452 is provided in the shape of a tub having a buffer space therein. The housing 452 is positioned downstream of the second valve 442 on the discharge line 440. The housing 452 has opposite ends, which are open, one of the opposite end serves as an entrance for the treatment liquid, and another of the opposite end serves as an exit for the treatment liquid. Accordingly, during discharging, the treatment liquid flows through the housing 452 without being filled in the buffer space beyond a specific water level. The second sensor 454 senses a second water level of the treatment liquid filled in the buffer space. The second sensor 454 senses the second water level higher than the specific water level in the space for the buffer 450. Accordingly, when sensing that the treatment liquid reaches the second water level in the space for the buffer 450, the second sensor 454 transmits a sensing signal to the controller 500.

The circulation line 460 circulates liquid, which flows along the supply line 420, to the liquid tank 415. The circulation line 460 branches from the supply line 420 in the upstream area of the supply line 420 and is connected to the liquid tank 415. The circulation line 460 branches upstream of the first valve 424 and a third valve 462 is mounted in the circulation line 460.

The controller 500 adjusts the valves 424, 442, and 462, and the pump 428 to control the flow of the liquid. The controller 500 may differently adjust each valve depending on a supply mode, a standby mode, and a maintenance mode. According to an embodiment, the supply mode may be a mode to supply the treatment liquid to the nozzle 410. The standby mode may be a mode in which the treatment liquid is not supplied to the nozzle 410. The maintenance mode is a mode to solve the problem that the treatment liquid is supplied to the nozzle 410 even in the standby mode due to the backflow and the overflow of the treatment liquid.

The controller 500 opens the first valve 424 and cuts off the second valve 442 and the third valve 462, in the supply mode. Accordingly, the treatment liquid may be supplied from the liquid tank 415 to the nozzle 410.

The controller 500 opens the first valve 424 and the second valve 442 and cuts off the third valve 462, in the standby mode. Accordingly, the treatment liquid may be discharged through the discharge line 440. For example, the treatment liquid discharged through the discharge line 440 may be circulated to the liquid tank 415. In addition, the controller 500 may adjust, in the standby mode, the flow pressure of the pump 428, such that the treatment liquid is filled in the first part 432 and the second part 434 of the downstream area 430 of the supply line 420 without being filled in the third part 436. This is to prevent foreign matters from being introduced into the pipe through the nozzle 410 by filling the treatment liquid in the first part 432 and the second part 434.

The controller 500 may cut off the first valve 424 and the second valve 442 and open the third valve 462 in the maintenance mode. Accordingly, the treatment liquid may be prevented from being supplied to the downstream area 430 of the supply line 420.

Figure 6:
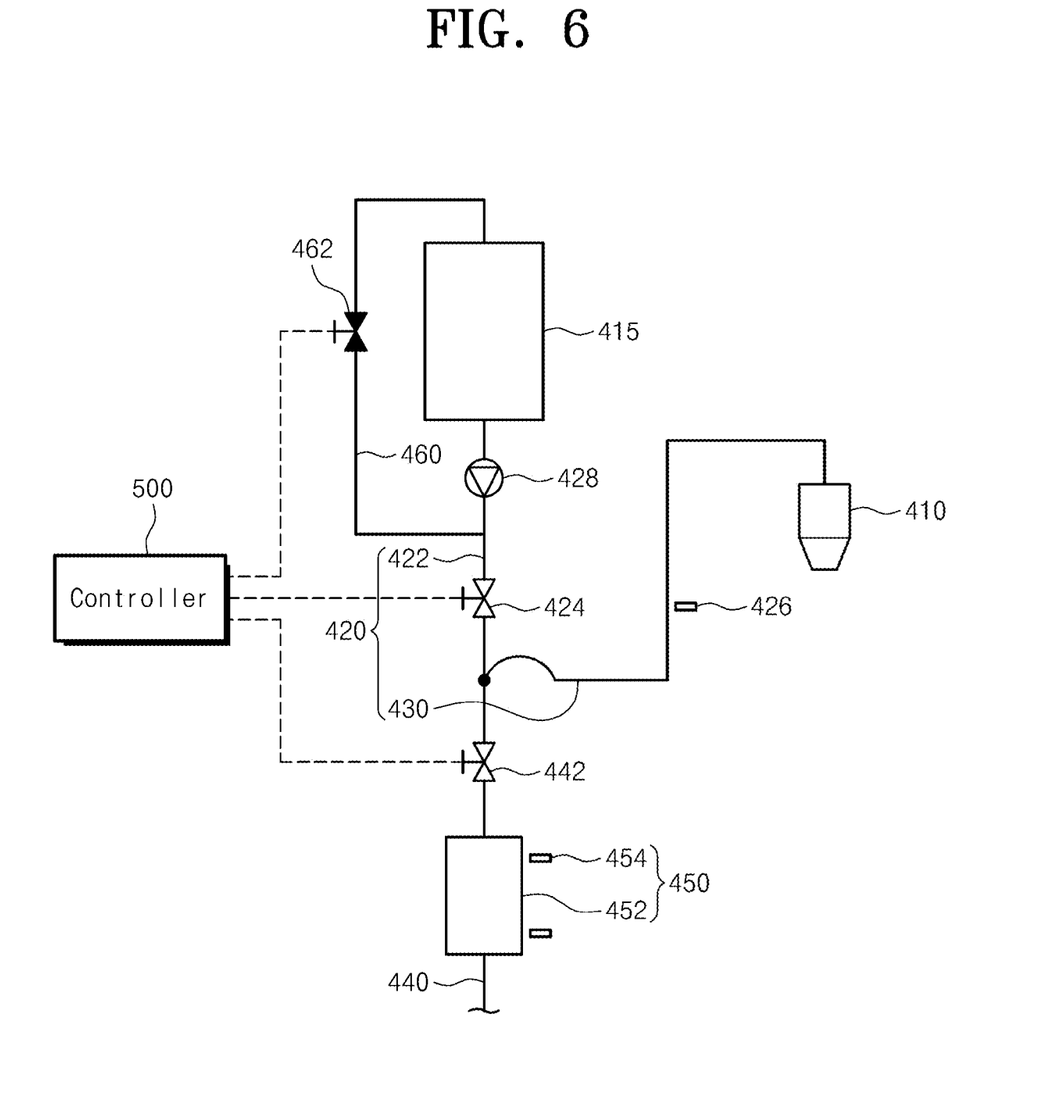
FIG. 6 is a view illustrating a standby mode in a liquid supply unit of FIG. 4.
Figure 7:
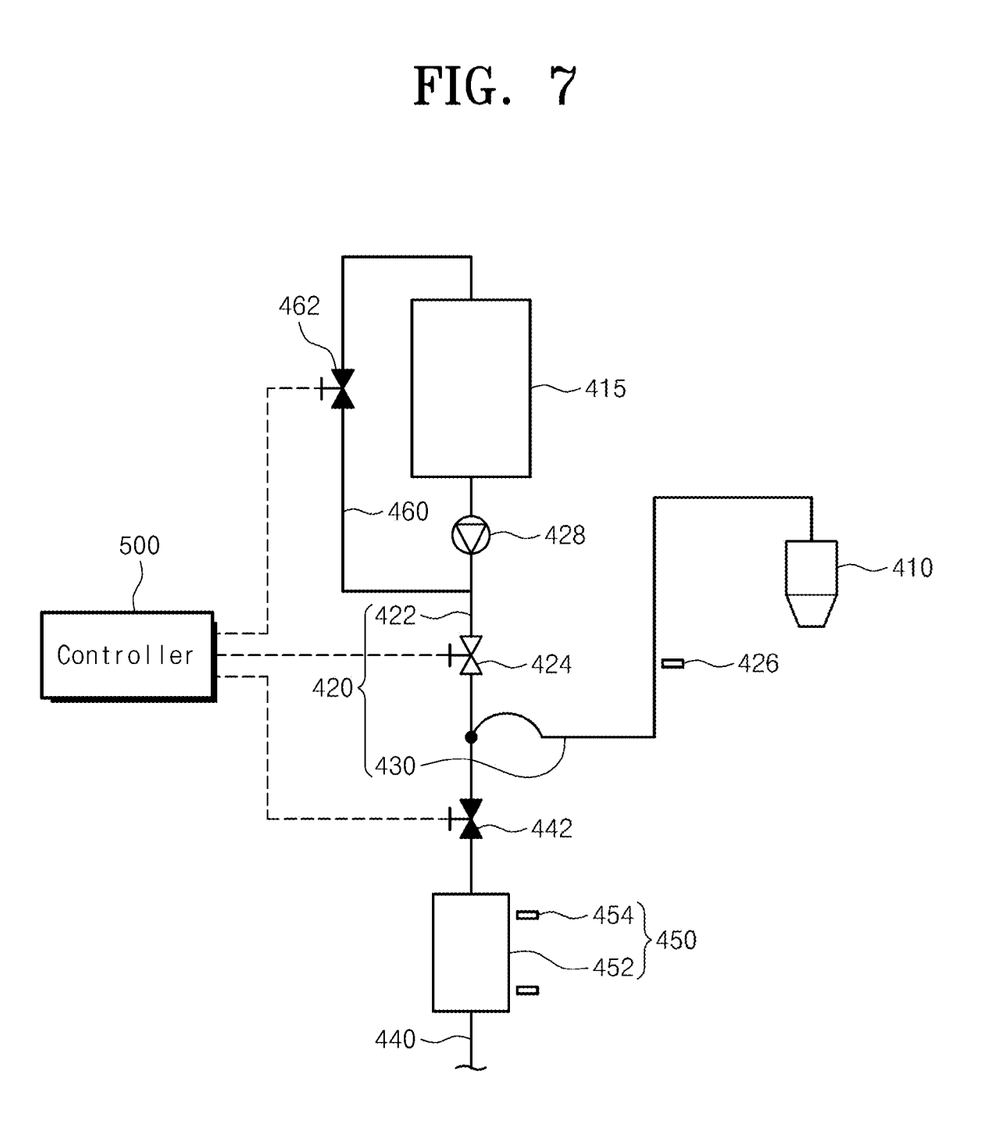
FIG. 7 is a view illustrating a supply mode in a liquid supply unit of FIG. 4.
Figure 8:
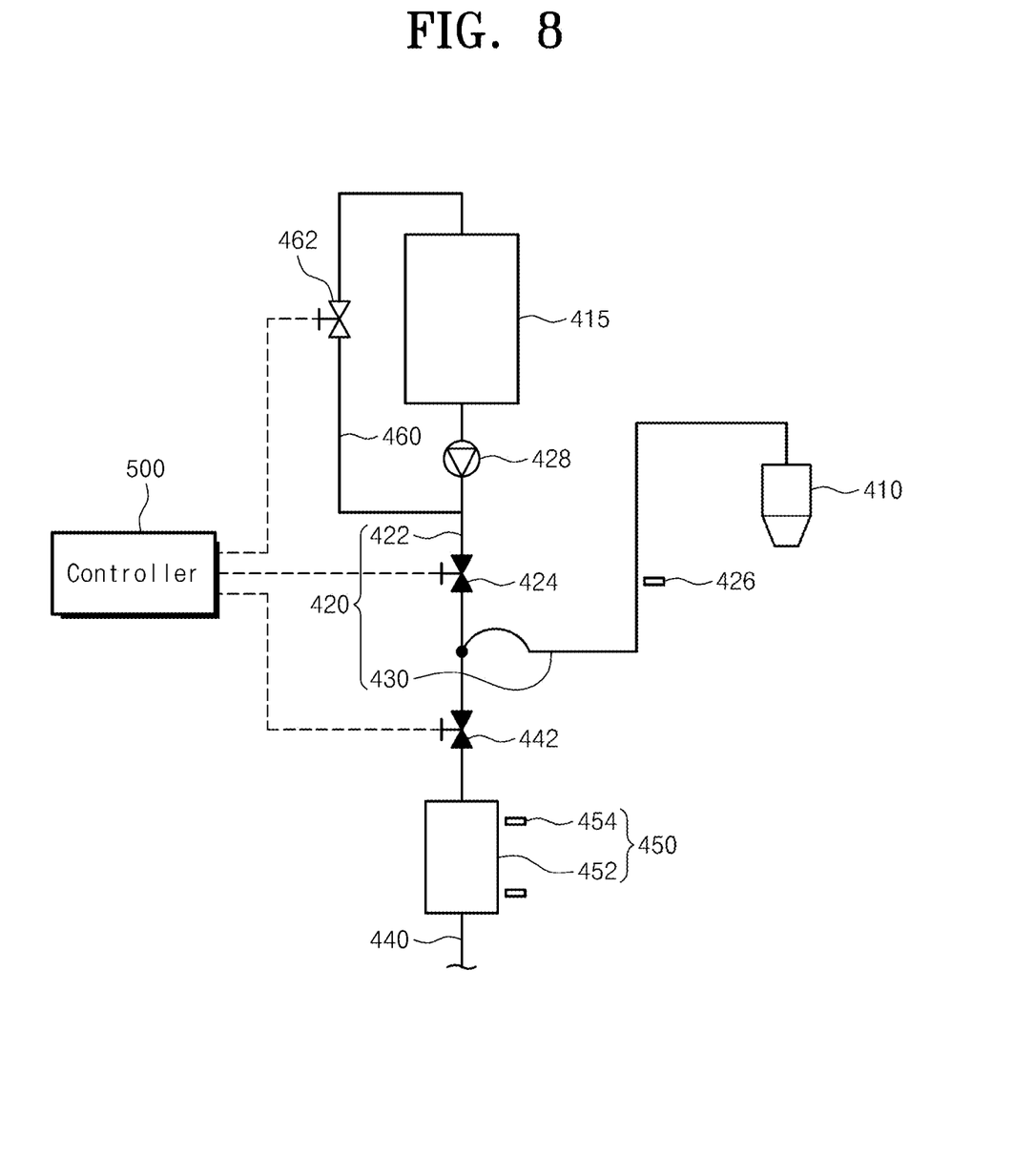
FIG. 8 is a view illustrating a maintenance mode in a liquid supply unit of FIG. 4.

Hereinafter, a procedure of performing the liquid treatment for the substrate 'W' will be described. FIG. 6 is a view illustrating a standby mode in the liquid supply unit of FIG. 4, FIG. 7 is a view illustrating a supply mode in the liquid supply unit of FIG. 4, and FIG. 8 is a view illustrating a maintenance mode in the liquid supply unit of FIG. 4. Referring to FIGS. 6 to 8, the standby mode is applied before the substrate 'W' is placed on the substrate support unit 340 or when the nozzle 410 stands by. In other words, the first valve 424 and the second valve 442 are open, but the third valve 462 is cut off. In the standby mode, the treatment liquid may be circulated through the supply line 420 and the discharge line 440.

When the substrate 'W' is placed on the substrate support unit 340, the nozzle 410 moves to the process position to discharge liquid, and the supply mode is applied to the liquid supply unit 400. In the supply mode, the first valve 424 is open, and the second valve 442 and the third valve 462 are cut off. Accordingly, the treatment liquid in the liquid tank 415 is transferred to the nozzle 410 along the supply line 420 and supplied onto the substrate 'W'. When the treatment liquid is completely supplied to the substrate 'W', the standby mode is applied to the liquid supply unit again, so the first valve 424 and the second valve 442 are open, and the third valve 462 is cut off. While the standby mode is being applied, backflow and overflow of the treatment liquid may occur in the discharge line 440 due to high pressure. In this case, the treatment liquid may be filled in the space for the buffer 450 and the third part 436. In this case, the first sensor 426 and the second sensor 454 sense that treatment liquid at the first water level reaches the third part 436 or treatment liquid at the second water level reaches the space for the buffer 459, and transmits the sensing signal to the controller 500. The controller 500 prevents the treatment liquid from being transferred to the nozzle 410 by cutting off the first valve 424 and the second valve 442 based on the sensing signal. However, even if receiving the sensing signal in the supply mode, the controller 500 may maintain the first valve 424 to be open.

According to the above-described embodiment, when the treatment liquid is supplied or the supply of the treatment liquid is stopped, the first valve 424 is always open. Accordingly, particles may be prevented in the procedure of opening or closing the first valve 424. In addition, as the treatment liquid is supplied or the supply of the treatment liquid is stopped, the second valve 442 is closed or open. However, the particles produced in the second valve 442 may be prevented from flowing downstream of the second valve 442 and being transferred to the nozzle 410. Accordingly, particles produced due to the opening/closing operation of a valve may be prevented from being transferred to the nozzle 410.

Figure 9:
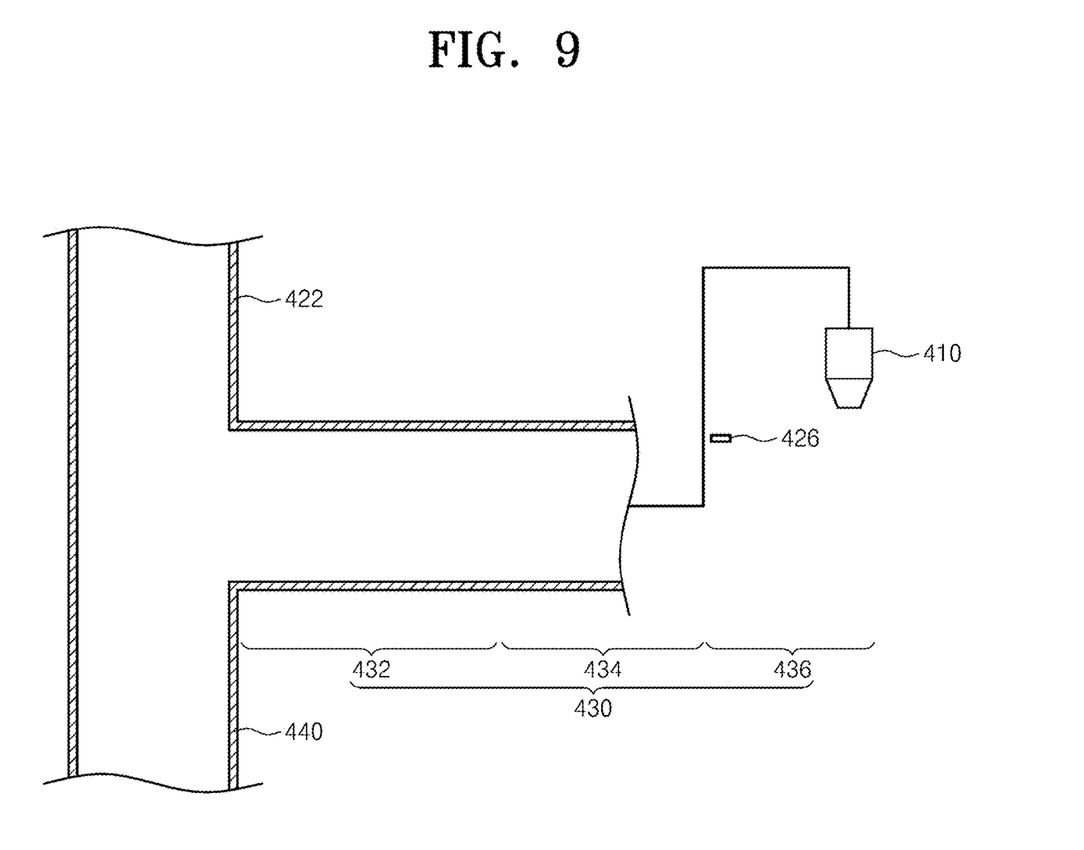
FIG. 9 is a view illustrating a liquid supply unit of FIG. 5, according to another embodiment.

In addition, the above-described embodiment has been described in that the first part 432 of the supply line 420 has the convex-upward shape. However, as illustrated in FIG. 9, the first part 432 has no height difference from the second part 434 in the longitudinal direction.

According to an embodiment of the inventive concept, the liquid may be supplied by the head difference of the supply line, and a valve is not provided in the downstream area of the branch point. Accordingly, the production of particles by the valve may be prevented, and a cleaning liquid may be supplied.

In addition, according to an embodiment of the inventive concept, the level sensor installed in the supply line and the buffer may sense the backflow and the overflow of the liquid, and cut off each valve to prevent the liquid from being supplied to the nozzle at undesirable timing.

In addition, according to an embodiment of the inventive concept, the downstream area of the supply line is maintained to be filled with a specific amount of liquid. Accordingly, the introduction of the external particles of the nozzle into the supply line may be minimized.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
a treating container defining a treatment space inside the treating container;
a substrate support unit configured to support a substrate in the treatment space; and
a liquid supply unit configured to supply treatment liquid the substrate supported by the substrate support unit,
wherein the liquid supply unit includes:
a nozzle:
a supply line configured to supply the treatment liquid to the nozzle;
a first valve mounted in the supply line; and
a discharge line branching from a branch point downstream of the first valve in the supply line, the discharge line configured to discharge the treatment liquid from the supply line;
a second valve mounted in the discharge line, and
wherein in the supply line, a valve is absent in an area between the branch point and the nozzle, in the supply line, and wherein a first part of a downstream area, which extends from the branch point in a downstream direction, having a curve shape;

a second part extending from the first part and provided at a position in a line with a position of the first part or lower than the position of the first part; and a third part extending from the second part, positioned higher than the first part, and including an end of the downstream area, and wherein a first sensor is installed in the third part to sense a water level of the treatment liquid in the downstream area.

2. The apparatus of claim 1, wherein the end of the downstream area of the supply line based on the branch point is above the discharge line.

3. The apparatus of claim 2, wherein the end of the downstream area is above the branch point.

4. The apparatus of claim 3, wherein the downstream direction is downward provided in an upstream area of the supply line based on the branch point, and wherein the curved shape is provided in a convex-upward shape.

5. An apparatus for treating a substrate, the apparatus comprising:

a treating container having a treatment space inside the treating container;

a substrate support unit configured to support a substrate in the treatment space; and a liquid supply unit configured to supply treatment liquid to the substrate supported by the substrate support unit, wherein the liquid supply unit includes:

a nozzle;

a supply line configured to supply the treatment liquid to the nozzle and having a first valve mounted in the supply line;

a discharge line branching from a branch point which is a point downstream of the first valve in the supply line to discharge the treatment liquid from the supply line, and having a second valve mounted in the discharge line;

a first sensor configured to sense a first water level of the treatment liquid in a downstream area, and wherein a valve is absent in an area between the branch point and the nozzle, in the supply line, and wherein an end of a downstream area of the supply line based on the branch point is positioned higher than the discharge line, and wherein the end of the downstream area is positioned higher than the branch point, and wherein an area of the downstream area, which extends from the branch point in a downstream direction, has a curved shape, and wherein the downstream direction is downwardly provided in an upstream area of the supply line based on the branch point, and wherein the curved shape is a convex-upward shape, and wherein the downstream area includes:

a first part extending from the branch point and having the curved shape;

a second part extending from the first part and provided at a position in a line with a position of the first part or lower than the position of the first part; and a third part extending from the second part, positioned higher than the first part, and including the end, and wherein the first sensor is installed in the third part.

6. The apparatus of claim 5, wherein the liquid supply unit further includes:

a buffer mounted downstream of the second valve in the discharge line and configured to temporarily store the treatment liquid in the buffer.

7. The apparatus of claim 6, wherein the buffer includes:

a housing mounted in the discharge line and defining a buffer space in the housing; and a second sensor configured to sense a second water level of the treatment liquid filled in the buffer space.

8. The apparatus of claim 5, wherein the liquid supply unit further includes:

a pump configured to apply flow pressure to the treatment liquid flowing along the supply line; and a controller configured to adjust supply of the treatment liquid to the nozzle, and wherein the controller is configured to control the second valve such that the second valve is cut off in a supply mode to supply the treatment liquid to the nozzle, and is open in a standby mode to inhibit the supply of the treatment liquid to the nozzle.

9. The apparatus of claim 8, wherein the controller is configured to cut off the first valve and the second valve, in response to receiving a sensing signal for the treatment liquid from the first sensor or a second sensor, the receiving in the standby mode.

10. The apparatus of claim 8, wherein the controller is configured to adjust the pump such that the treatment liquid is filled in the second part in the standby mode.

11. An apparatus for supplying liquid to a substrate comprising:

a nozzle;

a supply line configured to supply treatment liquid to the nozzle;

a first valve mounted in the supply line; and a discharge line branching from a branch point downstream of a first valve in the supply line and configured to discharge the treatment liquid from the supply line, and a second valve mounted in the discharge line, wherein a valve is absent in an area between the branch point and the nozzle, in the supply line, and wherein a first part of a downstream area, which extends from the branch point in a downstream direction, having a curve shape;

a second part extending from the first part and provided at a position in a line with a position of the first part or lower than the position of the first part; and a third part extending from the second part, positioned higher than the first part, and including an end of the downstream area, and wherein a sensor is installed in the third part to sense a water level of the treatment liquid in the downstream area.

12. The apparatus of claim 11, wherein an end of the downstream area of the supply line based on the branch point is above the branch point and the discharge line.

13. The apparatus of claim 11, wherein the downstream direction is downwardly provided in an upstream area of the supply line based on the branch point, and the curved shape is a convex-upward shape.

14. An apparatus for supplying liquid to a substrate comprising:

a nozzle;

a supply line configured to supply treatment liquid to the nozzle and having a first valve mounted in the supply line;

a discharge line branching from a branch point which is a point downstream of a first valve in the supply line to discharge the treatment liquid from the supply line, and having a second valve mounted in the discharge line; and a first sensor configured to sense a first water level of the treatment liquid in a downstream area, wherein a valve is absent in an area between the branch point and the nozzle, in the supply line, and wherein an end of a downstream area of the supply line based on the branch point is positioned higher than the branch point and the discharge line, and wherein an area of the downstream area, which extends from the branch point in a downstream direction, has a curved shape, and wherein the downstream direction is downward provided in an upstream area of the supply line based on the branch point, and wherein the curved shape is provided in a convex-upward shape, and wherein the downstream area includes:

a first part extending from the branch point and having the curved shape;

a second part extending from the first part and provided at a position in a line with a position of the first part or lower than the position of the first part; and a third part extending from the second part, positioned higher than the first part, and including the end, and wherein the first sensor is installed in the third part.

15. The apparatus of claim 14, further comprising:

a buffer mounted downstream of the second valve in the discharge line and configured to temporarily store the treatment liquid, and wherein the buffer includes:

a housing mounted in the discharge line and having a buffer space in the housing; and a second sensor configured to sense a second water level of the treatment liquid filled in the buffer space.

16. The apparatus of claim 11, further comprising:

a controller configured to adjust supply of the treatment liquid to the nozzle, wherein the controller is configured to control the second valve such that the second valve is cut off in a supply mode to supply the treatment liquid to the nozzle, and is open in a standby mode to stop the supply of the treatment liquid to the nozzle.

17. An apparatus for treating a substrate, the apparatus comprising:

a treating container defining a treatment space inside the treating container;

a substrate support unit configured to support a substrate in the treatment space; and a liquid supply unit configured to supply treatment liquid to the substrate supported by the substrate support unit, wherein the liquid supply unit includes:

a nozzle;

a supply line configured to supply the treatment liquid to the nozzle;

a first valve mounted in the supply line; and a discharge line branching from a branch point downstream of the first valve in the supply line, the discharge line configured to discharge the treatment liquid from the supply line;

a second valve mounted in the discharge line; and a first sensor configured to sense a first water level of the treatment liquid in a downstream area, wherein the downstream area includes:

a first part extending from the branch point and having a curved shape;

a second part extending from the first part and provided in line with the first part or lower than the first part; and a third part extending from the second part, above the first part, and including an end, and wherein the first sensor is in the third part, and wherein in the supply line, a valve is absent in an area between the branch point and the nozzle.

18. The apparatus of claim 17, wherein at the branch point an upstream area of the supply line extends collinearly with the discharge line.

* * * * *